(12) United States Patent
Takashima et al.

(10) Patent No.: US 8,906,808 B2
(45) Date of Patent: Dec. 9, 2014

(54) ETCHING METHOD

(71) Applicant: Tokyo Electron Limited, Tokyo (JP)

(72) Inventors: Ryuichi Takashima, Miyagi (JP); Yoshinobu Ooya, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/925,983

(22) Filed: Jun. 25, 2013

(65) Prior Publication Data

US 2014/0011363 A1    Jan. 9, 2014

Related U.S. Application Data

(60) Provisional application No. 61/668,192, filed on Jul. 5, 2012.

(30) Foreign Application Priority Data

Jun. 27, 2012 (JP) .................................. 2012-144614

(51) Int. Cl.
*H01L 21/308* (2006.01)
*H01L 21/3065* (2006.01)
*H01J 37/32* (2006.01)
*H01L 29/16* (2006.01)

(52) U.S. Cl.
CPC ........ *H01L 21/3088* (2013.01); *H01L 21/3065* (2013.01); *H01J 37/32091* (2013.01); *H01J 2237/334* (2013.01); *H01L 21/3086* (2013.01); *H01L 29/1608* (2013.01); *H01L 21/3081* (2013.01)
USPC .......................................... 438/702; 438/689

(58) Field of Classification Search
CPC ...................... H01L 21/3065; H01L 21/02296
USPC .................................................. 438/702, 689
See application file for complete search history.

(56) References Cited

U.S. PATENT DOCUMENTS 7,563,382 B2 *    7/2009    Osawa ............................ 216/47
2011/0220609 A1 *    9/2011    Yaegashi et al. ................ 216/12

FOREIGN PATENT DOCUMENTS

JP    2008-34635 A    2/2008

* cited by examiner

*Primary Examiner* — Marc Armand
*Assistant Examiner* — Damian A Hillman
(74) *Attorney, Agent, or Firm* — Rothwell, Figg, Ernst & Manbeck, P.C.

(57) ABSTRACT

A metal mask having an etching pattern having a very high verticality is formed, and an etching shape having a very high verticality is formed by etching a semiconductor with the metal mask as a mask.
A resist film patterned with a reversal pattern obtained by reversing an etching pattern is formed on a semiconductor (resist film forming process, S100), a metal paste is filled in the reversal pattern of the resist film (metal paste filling process, S200), a metal mask having the etching pattern is formed by removing the resist film while baking the metal paste by a heating control (metal mask forming process, S300), and plasma etching is performed on the semiconductor by using the metal mask (etching process, S400).

8 Claims, 12 Drawing Sheets

ETCHING METHOD

CROSS-REFERENCE

This application claims priority to U.S. Provisional Application 61/668,192 filed Jul. 5, 2012, and further claims priority to Japanese Application Number 2012-144614, filed Jun. 27, 2012, the entire contents of each of which are hereby incorporated by reference.

TECHNICAL FIELD

The present disclosure relates to an etching method of performing a plasma etching of a semiconductor using a metal mask.

BACKGROUND

Recently, as semiconductor etching technology is enhanced, it is possible to perform various kinds of processing on various semiconductors or metals. In the etching technology, dry etching by plasma using a reactive gas (plasma etching) and wet etching using a chemical liquid are mostly used, and the etching is separately used depending on the use.

For example, when a silicon carbide (SiC) substrate containing SiC, which is an etching target, is etched, plasma etching is used, in which a metal mask such as aluminum is used as a mask. Here, the metal mask is produced by forming a metal film on the SiC substrate and patterning an etching pattern with an opening on the metal film.

Wet etching may be used for forming the etching pattern of the metal mask (see, for example, Patent Document 1). This is because reducing the thickness of a resist film is much easier than etching a metal film due to the relationship of etching selection ratio between the metal film and the resist, and thus, it is difficult to etch a metal film with a sufficient thickness in plasma etching.

As described above, when an etching pattern of a metal mask is formed by wet etching, a resist with the same pattern as the etching pattern is formed on the metal film, the resist is put in a dissolution-removable chemical liquid (etchant), and the exposed portion is wet etched.

PRIOR ART DOCUMENT

Patent Document

Patent Document 1: Japanese Patent Laid-Open No. 2008-034635

DISCLOSURE OF THE INVENTION

Problems to be Solved

However, as described above, the chemical liquid used for wet etching of a metal film widens isotropically not only in a longitudinal direction but also in a transverse direction. That is, when an opening of an etching pattern is formed on a metal film by wet etching, the opening expands in the width direction of the opening as well as in the depth direction. In this case, since the opening is widened to the extent of the upper portion of the opening, the sidewall of the opening of the etching pattern of the resultant metal mask is not vertically formed, but is tapered, becoming narrow in the depth direction.

Accordingly, since the metal mask around the opening of the etching pattern becomes thinner as it goes down in the depth direction, the thin part is easily trimmed or peeled off in etching a semiconductor. Therefore, the etching shape of a semiconductor becomes tapered with a widened opening, such that there is a problem in that an etching shape having a high verticality cannot be formed.

Therefore, the present invention has been made in consideration of the above-mentioned problems, and an object is to provide an etching method that can form an etching pattern having a high verticality by forming an etching pattern for a metal mask, using a method except for wet etching, and can form an etching shape having a high verticality by etching a semiconductor with the metal mask as a mask.

Means to Solve the Problems

In order to solve the above problem, the present invention provides an etching method of etching a semiconductor, using a metal mask patterned with an etching pattern, the method including: a resist film forming process of forming a resist film patterned with a reversal pattern, which is obtained by reversing the etching pattern, onto the semiconductor; a metal paste filling process of filling the reversal pattern of the resist film with a metal paste; a metal mask forming process of forming a metal mask having the etching pattern by removing the resist film while baking the metal paste by a heating control; and an etching process of a plasma etching of the semiconductor using the metal mask.

According to the present invention, since the etching pattern of a metal mask is formed by a baked metal paste (e.g. a paste made of aluminum), it is possible to form an etching pattern having a very high verticality, as compared to a case where an etching pattern is formed by wet etching, as in the related art. In detail, since a resist film patterned with a reversal pattern obtained by reversing an etching pattern (e.g. a pattern in which a resist film is formed at an opening of an etching pattern and a resist film is not formed at the mask portion of the etching pattern) is first formed and a metal paste is filled in the reversal pattern, the filled metal paste may have a very high verticality.

That is, since a sidewall having a very high verticality is patterned in the resist film, it is also possible to make a sidewall of a metal paste very high vertical by filling the pattern of the resist film with the metal paste. Further, since the metal mask is formed by filling and baking a metal paste, as the resist film is made thicker, a thicker metal mask may be formed. Since the metal film is not etched as in the related art, a decrease in thickness of both of the metal paste and the resist film are not considered, and it is not required to determine the film thickness of the resist film in consideration of selectivity of the metal film and the resist film.

A metal mask having an etching pattern having a very high verticality may be formed by removing the resist film while baking the metal paste by a heating control. In the present invention, since the resist film may also be removed simultaneously in the process of baking the metal paste by the heating control, there is no need to provide a separate process of removing the resist film. Accordingly, it is possible to reduce the time taken to form a metal mask.

The heating control may include: a first process of heating to a first temperature equal to or higher than a temperature at which the resist film may be removed; a second process of maintaining the first temperature for a predetermined time; and a third process of heating to a second temperature higher than the first temperature that is determined depending on the kinds of metal pastes. It is possible to effectively remove a resist film or an organic solvent, which is not necessary except for the metal paste, by maintaining the first temperature (e.g.

400° C.) for a predetermined time. Further, it is possible to increase a stability of the metal mask to a semiconductor, which is an etching target, by appropriately setting the second temperature (e.g. 750° C.) depending on the kind of a metal paste.

In the metal mask forming process, the heating control may be performed in a state where the metal paste and the resist film are turned upside down so as to face down. Accordingly, even if a residual dross of the metal paste is remained on the resist film, the residual dross falls when the resist film is turned upside down and removed by heating, thereby easily removing the residual dross. Therefore, it is possible to prevent the residual dross of the metal paste, for example, from entering the opening of the etching pattern to influence the etching of a semiconductor.

The metal paste filling process may fill the reversal pattern of the resist film with the metal paste by using a squeegee method. By applying the metal paste onto the resist film using the squeegee method, it is possible to easily fill the reversal pattern of the resist film with the metal paste as well as to effectively prevent the metal paste from being applied to unnecessary portions on the resist film.

The metal paste is any one of for example, paste type aluminum (Al), chrome (Cr), nickel (Ni) and indium tin oxide (ITO). Further, the semiconductor may use any one of, for example, silicon carbide, silicon and gallium nitride.

The reversal pattern of the resist film may correspond to holes or trenches formed on the semiconductor in the etching process, in which the particle diameter of the metal paste may be 1/10 or less of the diameter of the holes or the width of the trenches. The hole includes both of a through hole and a non-through hole (also called a blind hole).

The etching process may be performed to etch the semiconductor in a depth of, for example, 90 μm or more or etch the semiconductor such that the semiconductor is penetrated.

Effect of the Invention

According to the present invention, by forming a metal mask with a metal paste, it is possible to pattern an etching pattern having a very high verticality and to enhance the verticality of the etching shape of a semiconductor by etching the semiconductor using the metal mask as a mask.

DETAILED DESCRIPTION TO EXECUTE THE INVENTION

Figure 1A:
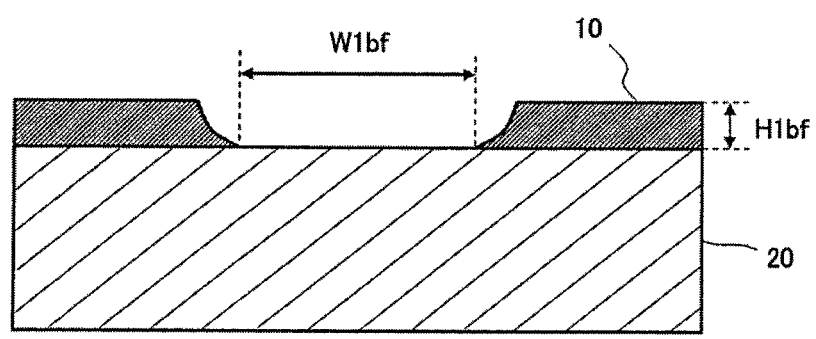
FIG. 1A is a cross-sectional view conceptually illustrating a tapered opening of a metal mask formed on an etching target film.

Hereinafter, preferred embodiments of the present invention will be described in detail with reference to the accompanying drawings. The components having substantially the same functions are given the same reference numerals in the specification and the drawings and their repeated description is omitted.

Before the etching method with a metal mask of the present invention is described, the difference between etching results due to the difference between the shapes of the openings of an etching pattern of a metal mask will be described with reference to the drawings.

Figure 1B:
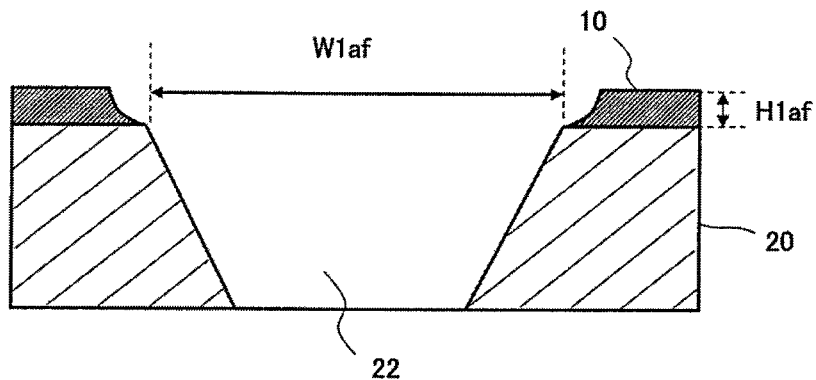
FIG. 1B is a cross-sectional view illustrating a result of etching an etching target film, using a tapered metal mask.
Figure 2:
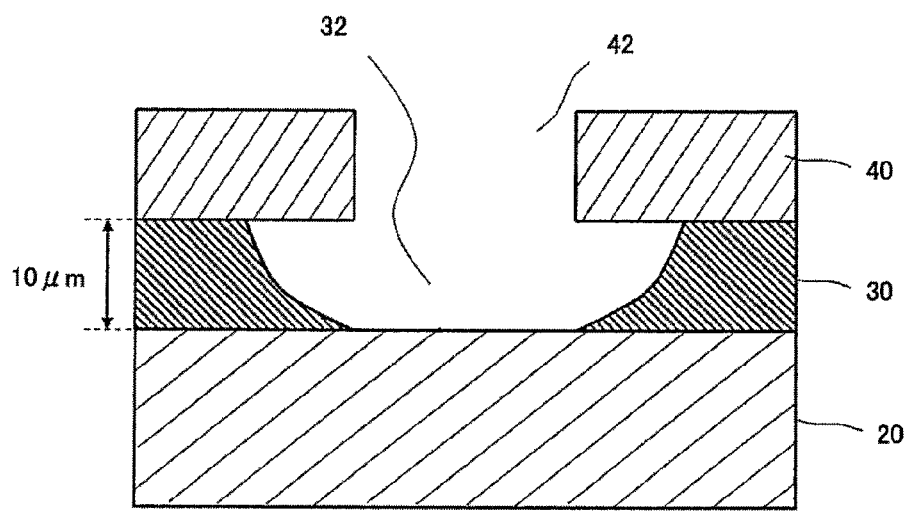
FIG. 2 is a cross-sectional view conceptually illustrating a process of forming a metal mask by means of wet etching.
Figure 3A:
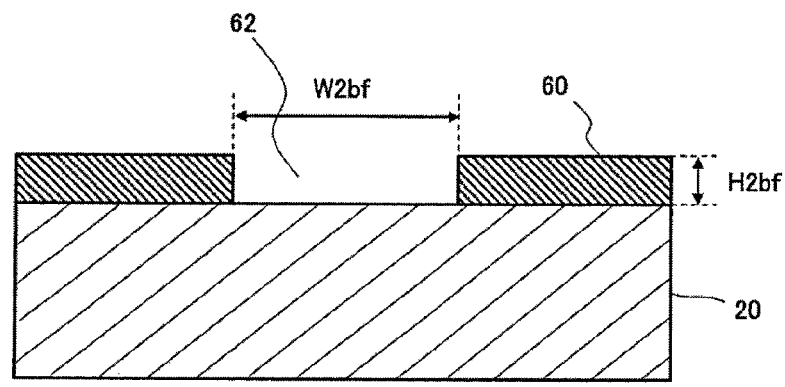
FIG. 3A is a cross-sectional view conceptually illustrating a vertical opening of a metal mask formed on an etching target film.
Figure 3B:
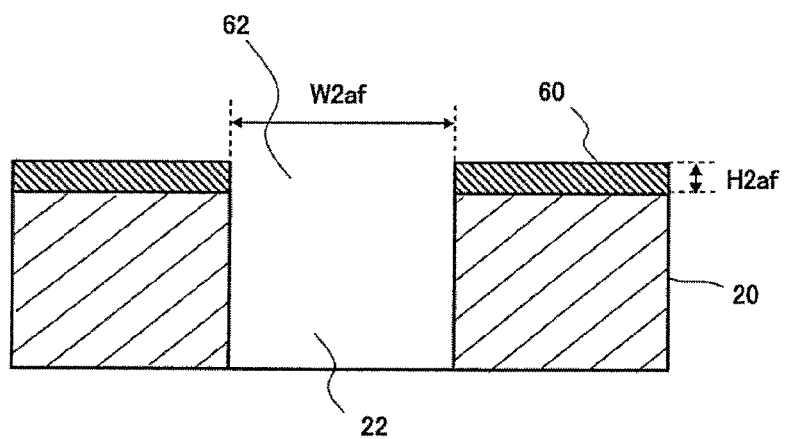
FIG. 3B is a cross-sectional view illustrating a result of etching an etching target film, using a vertical metal mask.

FIG. 1A is a cross-sectional view conceptually illustrating an opening with a tapered sidewall of an etching pattern of a metal mask formed on an etching target film (e.g. SiC film) and FIG. 1B is a cross-sectional view illustrating a result of etching an etching target film, using the metal mask having the tapered etching pattern. FIG. 2 is a cross-sectional view conceptually illustrating a process of forming a metal mask illustrated in FIG. 1A by means of wet etching. FIG. 3A is a cross-sectional view conceptually illustrating an opening with a vertical sidewall of an etching pattern of a metal mask formed on an etching target film (e.g. SiC film) and FIG. 3B is a cross-sectional view illustrating a result of etching an etching target film, using the metal mask having the vertical etching pattern.

A metal mask 10 with a tapered etching pattern illustrated in FIG. 1A is formed, for example, by wet etching a metal film 30 formed on an etching target film 20, as illustrated in FIG. 2. In detail, a resist film 40 with an opening 42 patterned is formed on the metal film 30 in wet etching of the metal film 30. Only the portion exposed by the opening 42 of the resist film 40 of the metal film 30 is wet etched by putting the portion into a chemical liquid. Accordingly, the etching pattern of an opening 32 illustrated in FIG. 2 may be formed.

However, at this time, the chemical liquid widens isotropically not only in a longitudinal direction but also in a transverse direction. For example, in wet etching for making a metal mask having a depth of 10 μm, the chemical liquid also widens to about 10 μm in the transverse direction of the metal film 30 under the resist film 40, as illustrated in FIG. 2. Therefore, the shape of the sidewall of the opening 32 of the resultant metal film 30 is tapered to be narrower in the depth direction, so the metal mask becomes thinner along the depth direction.

When the etching target film 20 is plasma etched using the metal mask having the tapered etching pattern, as illustrated in FIG. 1B, the opening of a recession 22 of the etching target film 20 becomes wide and tapered to be gradually narrower in the depth direction. Therefore, it is not possible to form a desired etching shape having a high verticality.

Specifically, as illustrated in FIG. 1A, when the etching pattern of the metal mask is tapered, since the metal mask gradually becomes thinner toward the center of the opening 32, the thin part is trimmed or peeled off in etching, such that an opening width W1$af$ of the recession 22 after the etching illustrated in FIG. 1B is larger than an opening width W1$bf$ of the recession 22 before the etching illustrated in FIG. 1A. For example, when the opening width W1$bf$ of the recession 22 before the etching is about 50 μm, the opening width W1$af$ of the recession 22 after the etching is widened approximately twice, to the extent of about 90 μm. Further, an entire thickness H1$af$ of the metal mask 10 after the etching is smaller than a thickness H1$bf$ of the metal mask before the etching.

Accordingly, when etching the etching target film 20, using a metal mask 60 with a vertical etching pattern, as illustrated in FIG. 3A, the opening width of the recession 22 of the etching target film 20 is not increased and the etching shape is also not tapered, as in FIG. 3B, such that vertical sidewall may be achieved. That is, the more the sidewall of an opening 62 of the metal mask 60 is close to being vertical, the less an opening width W2$af$ of the recession 22 after the etching can be different from an opening width W2$bf$ of the recession 22 before the etching. Further, it is the same as in the tapered metal mask (FIGS. 1A and 1B) that an entire thickness H2$af$ of the metal mask 60 after the etching is smaller than a thickness H2$bf$ of the metal mask before the etching.

In the plasma etching that uses a predetermined processing gas in etching while producing plasma, since anisotropic etching is possibly performed, it is considered that it is more possible to form a metal mask having a high verticality, than in the wet etching. However, in recent years, a very deep etching shape, for example, over tens to hundreds of micrometers is required as the etching shape of an etching target film, and in this case, etching is impossible unless a metal mask is also formed so as to be considerably thick. For example, in plasma etching of an SiC substrate, although aluminum (Al) having a high etching selection ratio is used, when the selection ratio (SiC/Al) is about 10, 10 μm or more of film thickness is required in order to etch the SiC substrate in a depth of about 100 μm. However, plasma etching is difficult in making a thick metal mask due to the strength relationship between metal and resist.

Accordingly, although wet etching is used to pattern an aluminum mask having a large film thickness in the related art, the sidewall of an opening is tapered when a metal mask is formed by wet etching as described above, and thus, there is a problem in that it is difficult to form a desired etching shape having a high verticality.

Therefore, in the present exemplary embodiment, a metal mask is formed by using a metal paste, not by using wet etching or plasma etching. Accordingly, it is possible to form a metal mask patterned with an etching pattern having a thick vertical opening.

(Etching Method with a Metal Mask According to the Present Exemplary Embodiment)

Figure 4:
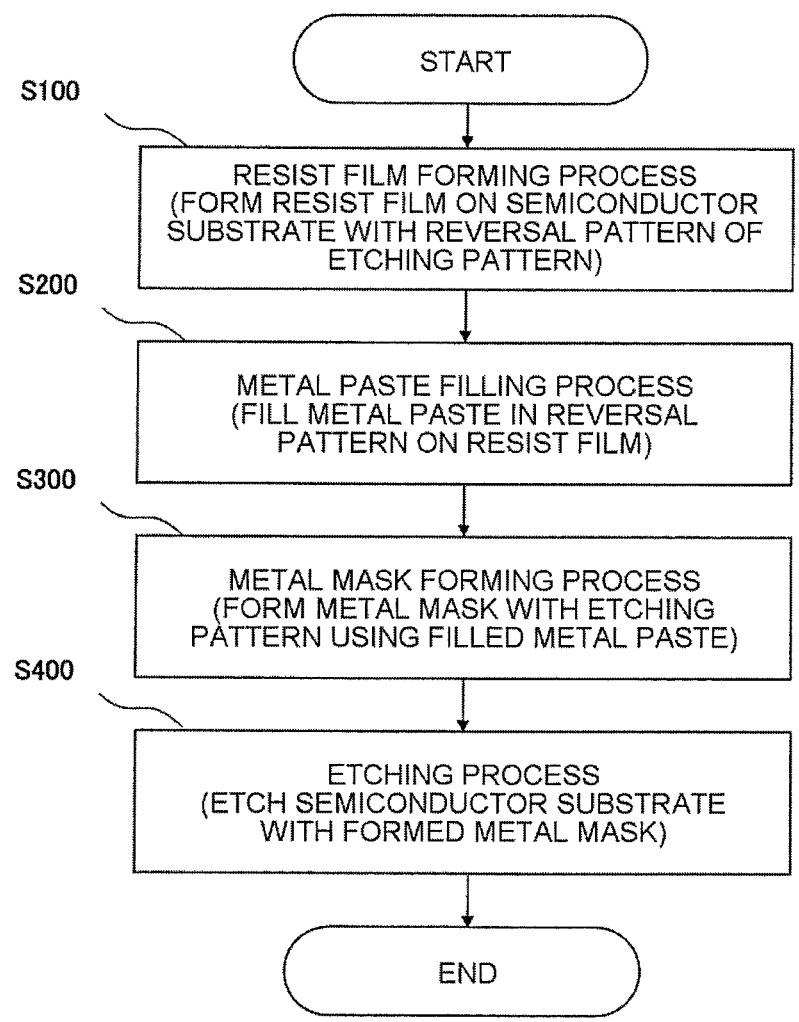
FIG. 4 is a flowchart illustrating a flow of processes in an exemplary embodiment of the present invention.

An etching method with a metal mask made of metal paste according to an embodiment of the present invention will be described with reference to the drawings. FIG. 4 is a flowchart illustrating the flow of processes of an etching method according to an embodiment of the present invention. FIGS. 5A to 5F are partial cross-sectional views schematically illustrating a state of a substrate, for illustrating the processes illustrated in FIG. 4.

Figure 5A:
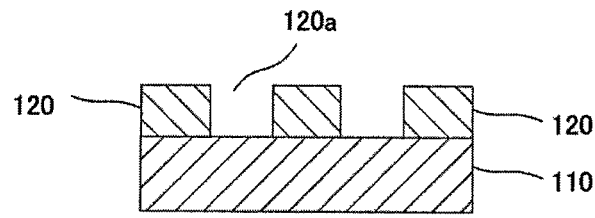
FIG. 5A is an operation flowchart illustrating a process of forming the resist film illustrated in FIG. 4, for describing the processes in the exemplary embodiment.
Figure 5B:
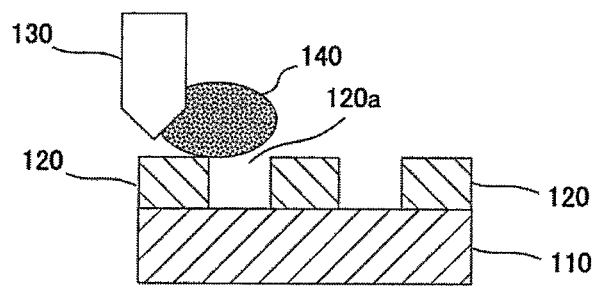
FIG. 5B is an operation flowchart continued from FIG. 5A and illustrating the metal paste filling process illustrated in FIG. 4.
Figure 5C:
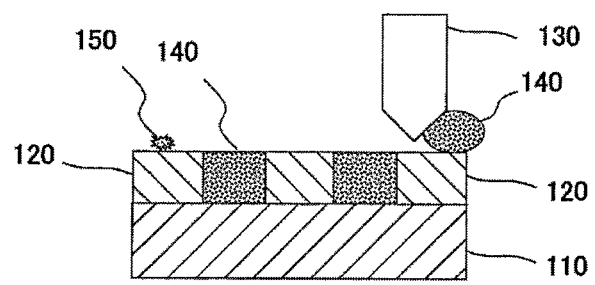
FIG. 5C is an operation flowchart continued from FIG. 5B and illustrating the metal paste filling process illustrated in FIG. 4.
Figure 5D:
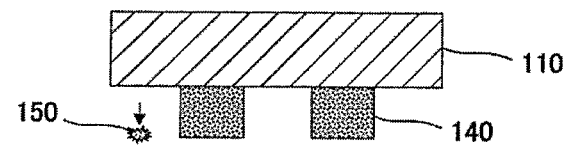
FIG. 5D is an operation flowchart continued from FIG. 5C and illustrating the metal mask forming process illustrated in FIG. 4.
Figure 5E:
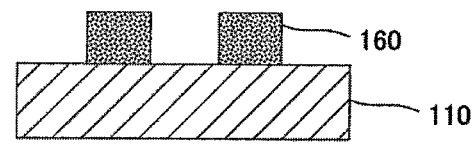
FIG. 5E is an operation flowchart continued from FIG. 5D and illustrating the metal mask forming process illustrated in FIG. 4.

As illustrated in FIGS. 4 and 5A to 5F, in the etching method of the present exemplary embodiment, a metal mask 160 is formed by forming a resist film 120 patterned with a reversal pattern 120$a$ for filling a metal paste 140, which is an etching target, on a semiconductor 110 in step S100 first, (resist film forming process: see FIG. 5A), performing a process of filling the reversal pattern 120$a$ with the metal paste 140 is performed in step S200 (metal paste filling process: see FIGS. 5B and 5C), and then removing the resist film 120 while baking the metal paste 140 by a heating control in step S300 (metal mask forming process: see FIGS. 5D and 5E). Further, plasma etching is performed on the semiconductor 110 with the metal mask 160 as a mask in step S400 (etching process: see FIG. 5F).

Hereinafter, the processes (steps S100 to S400) will be described in detail. In the present exemplary embodiment, there is exemplified a method for etching a silicon carbide (SiC) substrate, which is an example of a semiconductor, using a paste made of aluminum (hereafter, referred to as an aluminum paste), which is an example of metal paste, and using a metal mask made of the aluminum paste (hereafter, referred to as an aluminum mask). Therefore, in the following description, an aluminum paste is used as a metal paste, an aluminum mask is used as a metal mask, and an SiC substrate (silicon carbide substrate) is used as a semiconductor.

<Resist Film Forming Process>

First, the resist film forming process (step S100) illustrated in FIG. 4 will be described with reference to FIG. 5A. In the resist film forming process, a resist film 120 patterned with a reversal pattern 120$a$ for filling an aluminum paste 140 is formed on an SiC substrate 110, which is an etching target. The reversal pattern is obtained by reversing an etching pattern for forming an etching shape such as a hole or a trench in the SiC substrate 110

In detail, it is required to pattern an etching pattern, which has an opening for exposing an area where an etching shape (hole or trench) is formed on the SiC substrate 110 and a mask portion for masking such that the other areas are not exposed, on the metal mask for etching the SiC substrate 110. Accordingly, as the resist film for forming a metal mask, a resist film having a reversal pattern obtained by reversing its etching pattern, that is, a reversal pattern having an opening without forming a resist film in the area corresponding to the mask portion of an etching pattern and having a mask portion without forming a resist film in the area corresponding to the opening of the etching pattern, is formed. By forming the resist film having a reversal pattern, it is possible to fill the mask portion, not the opening, of the etching pattern of the SiC substrate 110 with an aluminum paste.

For example, photolithography may be used for forming the resist film 120. In detail, ultraviolet rays are first radiated to the resist film 120 through a photomask designed to expose a desired pattern to ultraviolet rays, and then developing is performed, thereby forming a reversal pattern 120a on the resist film 120. Accordingly, for example, as illustrated in FIG. 5A, the sidewall of the opening of the resist film 120 may be made vertical.

Further, according to this method, it is possible to form a sidewall having a high verticality, even if the thickness of the resist film 120 is made thick. According to the resist film 120 formed as described above, since no problem arises due to a thickness, unlike forming an aluminum mask by etching the metal film as described above, it is possible to make the formed aluminum mask thicker by filling the reversal patter of a thick resist film with an aluminum paste. For example, the resist film having a film thickness of 100 μm as described above may be formed.

Further, when filling the aluminum paste, the strength of the resist film 120 may be increased by performing heat treatment after forming the resist film 120 such that the reversal pattern 120a of the resist film 120 is not deformed.

<Metal Paste Filling Process>

Next, the metal paste filling process (step S200) illustrated in FIG. 4 will be described with reference to FIGS. 5B and 5C. In the metal paste filling process, the aluminum paste 140 is filled into the reversal pattern 120a of the resist film 120. The aluminum paste 140 is, for example, a paste type aluminum pigment and made of high-purity aluminum. The aluminum paste has been known as being mainly used for electrodes of solar cells or the paint of vehicles. In general, a metal paste is made up of metal powder, a solvent, a resin (binder). The aluminum paste used in the present exemplary embodiment is baked and brought into close contact with the SiC substrate 110 in the following metal mask forming process (S300). Accordingly, considering this property, it is preferred to regulate the components of the aluminum paste. For example, use is made to an aluminum paste prepared by adding an organic solvent to 48.7% of high-purity aluminum powder, 2.0% of glass powder 2.0% and 5.6% of resin.

For example, atomization may be used for preparing high-quality metal powder. The atomization is a method of preparing metal powder by powdering molten aluminum using gas energy. According to the atomization, it is possible to control the particle diameter of aluminum paste. It is preferred that the particle diameter of the aluminum paste is ⅒ or less of the diameter of a hole or the width of a trench in a case where the hole or the trench is formed in a semiconductor, which is an etching target in the following etching process (step S400). For example, when the diameter of a hole or the width of a trench is 50 μm to 60 μm, the particle diameter of aluminum is preferably about 3 μm.

(Filling with Aluminum Paste)

In the metal paste filling process, the aluminum paste is filled into the opening of the reversal pattern 120a of the resist film 120 formed in the step S100. For example, a squeegee method may be used for filling the aluminum paste. The squeegee (or squilgee) is a tool generally used for removing water of a flat surface with a straight and smooth rubber blade. According to the squeegee method, it is possible to apply an aluminum paste by allowing a rubber squeegee to slide on the resist film 120.

A method of filling an aluminum paste using the squeegee method will be described with reference to FIGS. 5B and 5C. As illustrated in FIGS. 5B and 5C, the aluminum paste 140 is applied throughout the resist film 120 formed in the resist film forming process (step S100), with a rubber squeegee 130.

In this process, it is preferred to move the squeegee 130 holding the aluminum paste 140 such that the resist film 120 is not pressed too much and to apply the aluminum paste 140 such that a residual dross 150 as illustrated in FIG. 5C does not remain on the mask portion of the reversal pattern 120a. Accordingly, the aluminum paste 140 is filled in the opening of the reversal pattern 120a of the resist film 120. Even if there is any residual dross 150, the residual dross may be removed simultaneously with baking of the aluminum paste 140 by the heating control in the following metal mask forming process. Therefore, a separate removing work such as grinding for removing the residual dross 150 of the aluminum paste may be removed. This will be described in detail below.

Figure 6A:
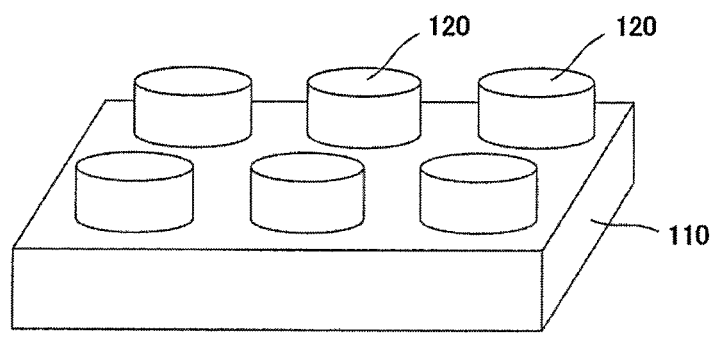
FIG. 6A is a view illustrating a reversal pattern of the etching pattern for forming a hole.
Figure 6B:
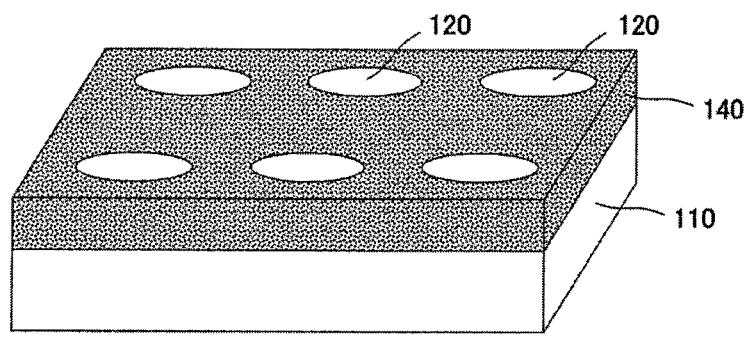
FIG. 6B is a view illustrating an aluminum paste filled in the reversal pattern of FIG. 6A.
Figure 7A:
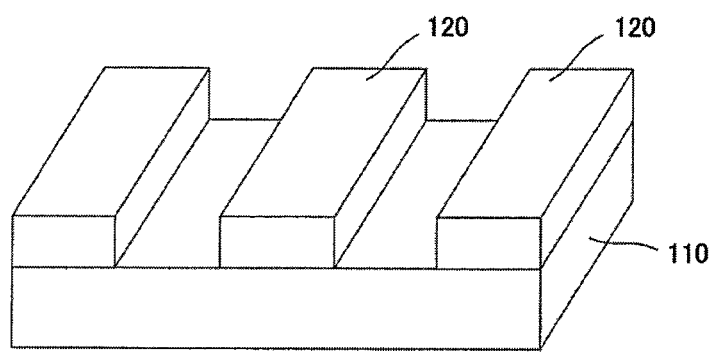
FIG. 7A is a view illustrating a reversal pattern of the etching pattern for forming a trench.
Figure 7B:
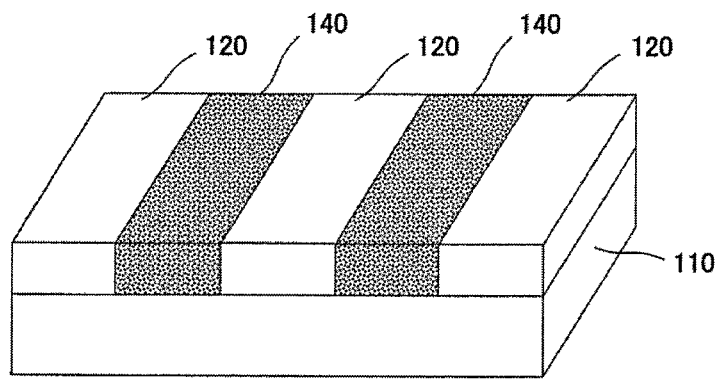
FIG. 7B is a view illustrating an aluminum paste filled in the reversal pattern of FIG. 7A.

As a result, the aluminum paste 140 is filled in the reversal pattern on the resist film 120. The states before and after the aluminum paste 140 is filled are illustrated in FIGS. 6A, 6B, 7A and 7B. FIGS. 6A and 6B illustrate a case where an etching pattern of holes is made of an aluminum paste, and FIGS. 7A and 7B illustrate a case where an etching pattern of trenches is made of an aluminum paste.

First, when an etching pattern for forming holes is made of an aluminum paste, a reversal pattern is formed on the resist film 120, as illustrated in FIG. 6A. That is, in the etching pattern, the resist film 120 is formed at the area where an opening is formed to form a hole and a resist film is not formed at the surrounding area where a mask portion is formed.

The result illustrated in FIG. 6B is obtained by filling the reversal pattern of the resist film 120 with an aluminum paste. That is, in the etching pattern, the area where a hole is formed is not filled with the aluminum paste 140 and the surrounding area where a mask portion is formed is filled with the aluminum paste 140.

Next, when an etching pattern for forming trenches is made of an aluminum paste, a reversal pattern is formed on the resist film 120, as illustrated in FIG. 7A. That is, even in this case, in the etching pattern, the resist film 120 is formed at the area where an opening is formed to form a trench and the resist film is not formed at the surrounding area where a mask portion is formed.

The result illustrated in FIG. 7B is obtained by filling the reversal pattern on the resist film 120 with an aluminum paste. That is, in the etching pattern, the area where a trench is formed is not filled with the aluminum paste 140 and the surrounding area where a mask portion is formed is filled with the aluminum paste 140.

Further, in a case where the reversal pattern 120a is a trench type, when the aluminum paste 140 is applied by allowing a squeegee to slide along the trench, the aluminum paste hardly remains on the resist film 120.

Figure 8A:
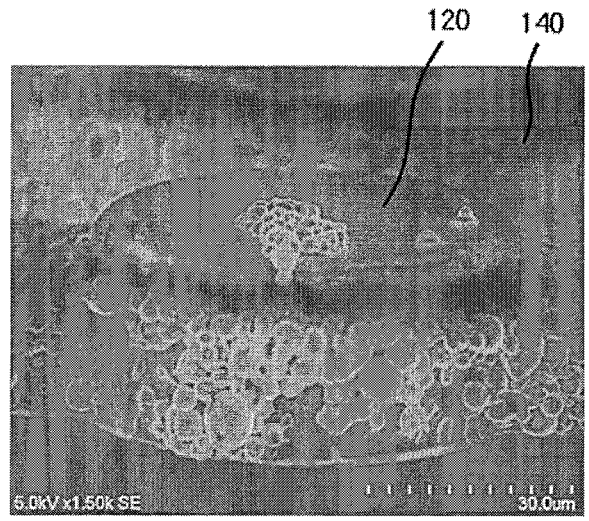
FIG. 8A is a picture of an aluminum paste filled around a resist portion corresponding to a hole, taken by an electron microscope.
Figure 8B:
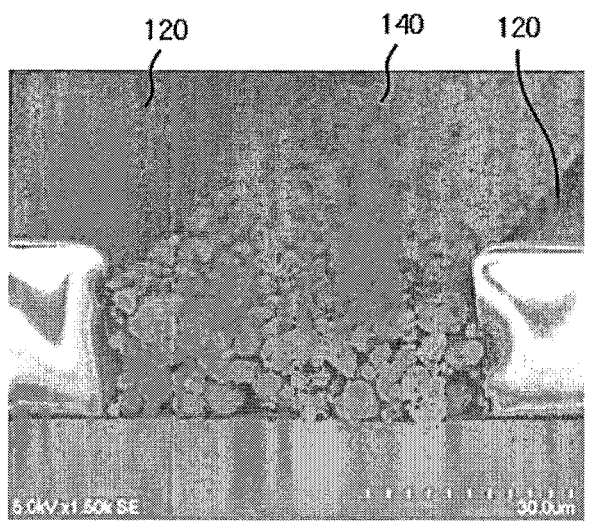
FIG. 8B is a picture of an aluminum paste filled around a resist portion corresponding to a trench, taken by an electron microscope.

Electron microscope photographs when an aluminum paste is actually filled by the squeegee method are shown in FIGS. 8A and 8B. FIGS. 8A and 8B are electron microscope photographs of the aluminum paste 140 filled in an opening of the reversal pattern 120a by the metal paste filling process (step S200). FIG. 8A illustrates the cross-section of a portion of a reversal pattern for forming holes in the SiC substrate 110. The substantially circular shape at the center in the picture of FIG. 8A is the resist film 120 and the part filled around the resist film 120 is the aluminum paste 140.

FIG. 8B illustrates the cross-section of a part of a reversal pattern for forming trenches on the SiC substrate 110. The substantially rectangular portion at the center in the photograph of FIG. 8B is the aluminum paste 140 and the portion at both sides thereof is the resist film 120. It is understood that the aluminum paste 140 is vertically formed in both of FIGS. 8A and 8B.

As described above, when filling the reversal pattern 120a of the resist film 120 with the aluminum paste, it is possible to fill the aluminum paste 140 while pressing the rubber squeegee 130 on the entire resist film 120 by using the squeegee method, thereby making it difficult for a cavity to be formed on the sidewall of the opening of the reversal pattern 120a. Further, when the film thickness of the resist film 120 is sufficiently large as in the present exemplary embodiment, the resist film 120 is difficult to be damaged even if the resist film 120 is pressed by the squeegee 130.

In the present exemplary embodiment, the squeegee method is exemplified as a method of filling the aluminum paste 140, but not limited thereto. For example, the aluminum paste 140 may be filled by a spin coat method.

<Metal Mask Forming Process>

Next, the metal mask forming process (step S300) illustrated in FIG. 4 will be described with reference to FIGS. 5D, 5E, 9, and 10. In the metal mask forming process, the resist film 120 is removed while baking the aluminum paste 140 by performing the heating control on the SiC substrate 110, and accordingly, an aluminum mask 160 patterned with an etching pattern is formed. That is, the aluminum paste 140 is baked on the SiC substrate 110 by heating the aluminum paste 140 to sinter the particles, thereby forming the aluminum mask. Both of the resist film 120 and the residual dross 150 of the aluminum paste are simultaneously removed by the heating control. Therefore, there is no need to provide a separate process of removing the resist film 120.

In the heating control in the metal mask forming process, heating is performed while maintaining temperatures at a plurality of steps for predetermined times. Accordingly, it is possible to efficiently bake the metal paste and simultaneously remove the resist film in the baking process. For example, the heating control includes three steps, that is a first process of heating to a first temperature equal to or higher than a temperature at which a resist film is removed, a second process of maintaining the first temperature for a predetermined time, and a third process of heating to a second temperature, which is determined depending on the kinds of metal pastes.

(Heating Control in Baking)

Figure 9:
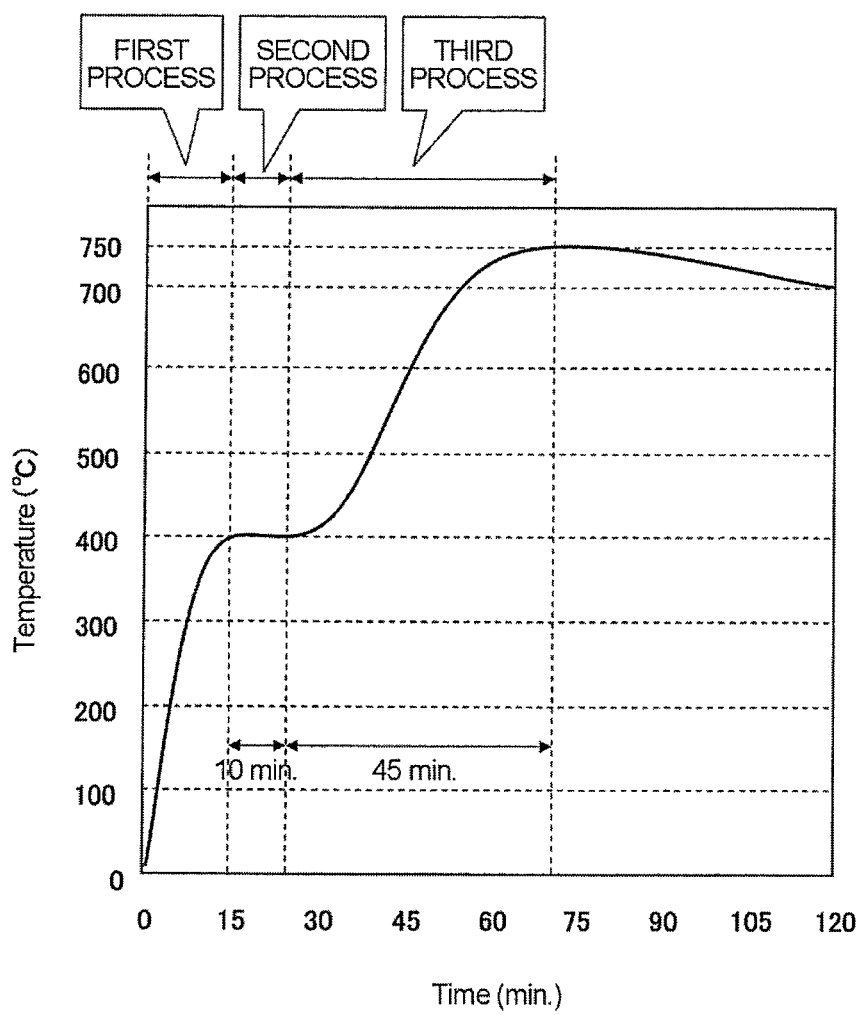
FIG. 9 is a graph illustrating a change in temperature in a heating control of the metal mask forming process illustrated in FIG. 4.

Hereinafter, a specific example of the heating control of the SiC substrate 110 will be described with reference to FIG. 9. The heating control is performed in a circulation atmosphere containing, for example, an oxygen gas ($O_2$ gas) or a nitrogen gas ($N_2$ gas) at a flow rate of 20 slm (standard liter/min, liter per minute at 1 atm and 0° C.). FIG. 9 is a graph showing a change in temperature by the heating control according to the present exemplary embodiment.

As illustrated in FIG. 9, the temperature is increased from room temperature to a first temperature equal to or higher than a temperature at which the resist film 120 is removed, for example, 400° C. over about 15 minutes (first process) and is maintained for a predetermined time (e.g. 10 minutes) (second process). The reason that the first temperature is set to 400° C. is to remove the organic components in the metal paste, as well as the resist film 120. That is, it is sufficient to heat to about 200° C. in order to remove only the resist film 120, but the organic components in the metal paste may also be removed at about 400° C. Accordingly, better baking may be achieved. Further, the first temperature is not limited thereto and may be freely set as long as at least the resist film 120 may be removed.

As illustrated in FIG. 5D, the baking may be performed in a state where the SiC substrate 110 turned upside down, that is, the aluminum paste 140 and the resist film 120 face down in the gravity direction. Accordingly, when the resist film 120 is removed by heating, the residual dross 150 falls, and thus the residual dross is easily removed. Therefore, it is possible to prevent the residual dross 150 of the metal paste, for example, from entering the opening of the etching pattern to influence the etching of a semiconductor.

Further, in a case where the SiC substrate 110 is placed on a loading table and is subjected to a heating treatment, it may not need to turn over the SiC substrate 110. It may be possible to load the SiC substrate 110 turned upside down via a holding table onto the loading table when turning the SiC substrate upside down, or it may be possible to dispose a holding mechanism that holds the SiC substrate 110 in a state of turning upside down.

Thereafter, the temperature is increased to a second temperature (third process). The second temperature is determined depending on the kind of the metal paste. Here, the second temperature is a temperature for stabilizing the aluminum paste 140 on the SiC substrate 110, for example, 750° C. Further, when nickel (Ni) is used as the metal paste, it is preferred to set the second temperature to 1,500° C.

After reaching the second temperature, the second temperature may be maintained or gradually decreased. In this case, it may be desirable to stop heating and allow the substrate to be left for a predetermined time. As the high-temperature state is maintained for a long period of time, the adhesion of the aluminum paste 140 to the SiC substrate 110 may be enhanced. For example, when the second temperature reaches 750° C. and then gradually decreased, it may be set to take 7 hours until the temperature drops from 750° C. to 200° C.

The temperature control in baking was described above. In order to bring the aluminum paste 140 in close contact with the SiC substrate 110, it is preferred to optimize the temperature control in baking in this process, other than regulating the components of the aluminum paste 140, as described above.

In the present exemplary embodiment, the residual dross of the aluminum paste is reduces in the area where the resist film 120 is removed, by subjecting to the baking in a state where the SiC substrate 110 is turned upside down such that the resist film having the reversed patter filled with the aluminum paste faces down, as described above. However, it may be possible to wet-clean the substrate with an agent in consideration of the possibility of residual dross of the aluminum paste remained in the area where the resist film 120 is removed after baking. Since the aluminum mask is strongly close contact with the SiC substrate after the baking, wet cleaning is not problematic, but it is preferred to avoid an extreme wet cleaning to the extent that the aluminum mask is influenced.

(Example of Configuration of Heat Treatment Device)

Figure 10:
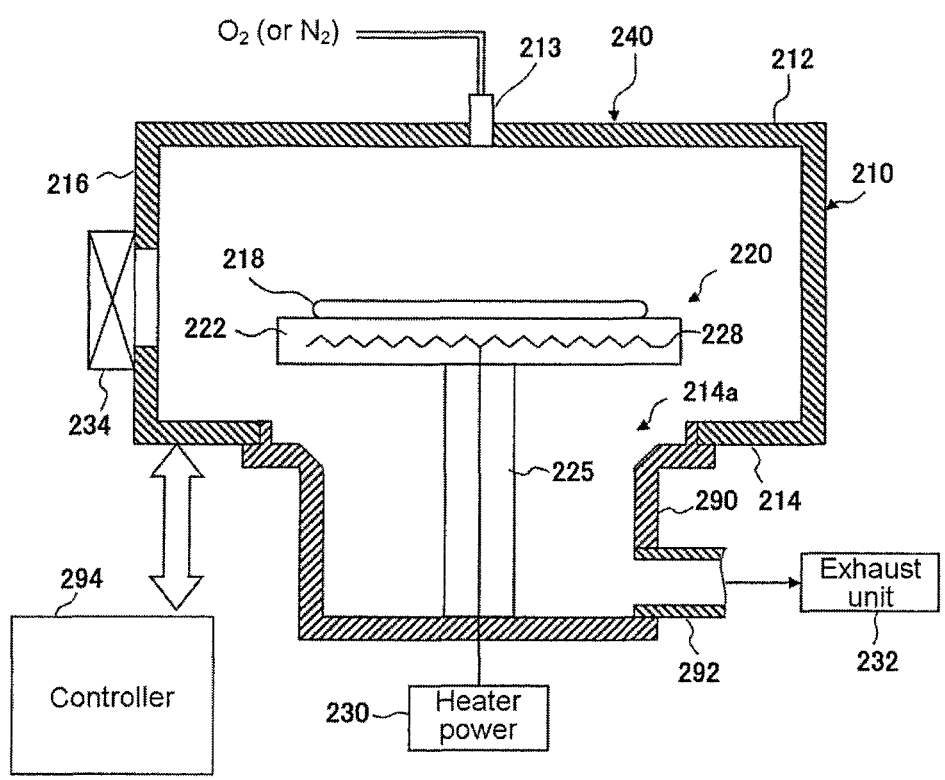
FIG. 10 is a cross-sectional view illustrating a schematic configuration of a thermal treatment device capable of performing the metal mask forming process illustrated in FIG. 4.

An example of the configuration of a heat treatment device capable of performing the metal mask forming process including the heating control of the SiC substrate will be described herein. FIG. 10 is a vertical cross-sectional view illustrating a schematic configuration of a heat treatment device 200 according to the present exemplary embodiment. The heat treatment device 200 includes a substantially cylindrical hermetic processing chamber 210 and can perform a baking process of receiving baking targets 218 one by one in the processing chamber 210 and baking the baking targets 218.

A ceiling wall 212 of the processing chamber 210 is provided with a gas inlet 213 which introduces oxygen gas ($O_2$ gas) or nitrogen gas ($N_2$ gas) from a gas supplier (not illustrated) toward a substrate loaded on a loading table 220.

A circular opening 214a is formed at the center portion of a bottom wall 214 of the processing chamber 210, and an exhaust chamber 290 protruding downward to cover the opening 214a is connected to the bottom wall 214. An exhaust unit 232 is connected to the sidewall of the exhaust chamber 290 through an exhaust pipe 292. It is possible to reduce the pressure in the processing chamber 210 at a predetermined degree of vacuum by operating the exhaust unit 232.

A gate valve G opening/closing a carrying-in/out port for carrying in/out the baking targets 218 to/from the processing chamber 210 is disposed at a sidewall 216 of the processing chamber 210.

The loading table 220 where the baking targets 218 are placed is disposed in the processing chamber 210. The loading table 220 has a disc-shaped loading table body 222 where the baking targets 218 are placed and a cylindrical pillar 225 supporting the loading table body 222.

A heater 228 is embedded in the loading table body 222. The heater 228 generates heat by means of power supplied from a heater power supply 230, and the temperature of the baking targets 218 is adjusted by the operation of the heater 228.

The heat treatment device 200 includes a controller 294 controlling the entire operation of the device. The controller 294 includes an operating unit that is implemented by a touch panel, a keyboard or a display, and a memory unit that stores programs for the heating control in the metal mask forming process according to the present exemplary embodiment or processing conditions (recipes) for executing the programs, which are not illustrated.

The controller 294 controls the parts, including the heater power 230, by reading out a desired program or processing condition from the memory on the basis of instructions from the operating unit, and is configured to perform a desired heating control in the heat treatment device 200. The programs and the processing conditions may be stored in a hard disk or a semiconductor memory, or may be stored in a storage medium that can be read by a portable computer such as a CD-ROM or a DVD and set at a predetermined position in the memory.

In a case where the heating control of the metal mask forming process illustrated in FIG. 4 is performed by the heat treatment device 200, the SiC substrate 110 filled with an aluminum paste in the metal paste filing process first, which is the baking target 218, is first carried in from the carrying-in/out port through the gate valve G by a transportation arm (not illustrated) and placed onto the loading table 220. When facing up, the SiC substrate 110 is placed onto the loading table 220 as it is, but when the SiC substrate 110 faces down as illustrated in FIG. 5D, for example, a holding unit (not illustrated) may be disposed at the loading table 220 to hold the peripheral portion of the substrate.

Subsequently, the heater 228 operated by the heater power supply 230 is controlled by the controller 294, and the temperature is controlled, for example, as illustrated in FIG. 9. Accordingly, as illustrated in FIG. 5D, the resist film 120 is removed while the aluminum paste 140 on the SiC substrate 110 is baked, thereby forming the aluminum mask 160 having a desired etching pattern (FIG. 5E).

Although the sheet type heat treatment device that processes baking targets one by one is exemplified as a heat treatment device, the present disclosure is not limited thereto, and a batch type heat treatment device that collectively processes a plurality of sheets of baking targets may be used.

<Etching Process>

Figure 5F:
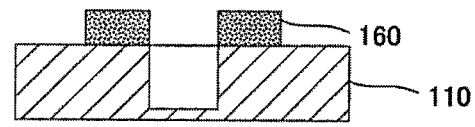
FIG. 5F is an operation flowchart continued from FIG. 5E and illustrating the etching process illustrated in FIG. 4.

Next, the etching process (step S400) illustrated in FIG. 4 will be described with reference to FIG. 5F. In the etching process, plasma etching is performed on the SiC substrate 110 with the aluminum mask 160, which is formed on the SiC substrate (corresponding to the semiconductor in FIG. 5F) 110 by steps S100 to S300, as a mask.

For example, the plasma etching is performed on the SiC substrate 110 by using sulfur hexafluoride ($SF_6$) as an etching gas and producing plasma on the SiC substrate 110. Accordingly, as illustrated in FIG. 5F, in the SiC substrate 110, the surface exposed by the opening of the aluminum mask 160 is selectively etched and is etched to a predetermined depth by continuing the plasma etching for a predetermined time. As a result, an etching shape such as a hole or a trench is formed on the SiC substrate 110. Since the sidewall of the opening of the aluminum mask formed in accordance with the present exemplary embodiment is vertical as illustrated in FIG. 3A, a vertical etching shape is formed on the SiC substrate 110, as illustrated in FIG. 3B.

(Example of Configuration of Plasma Processing Device)

Figure 11:
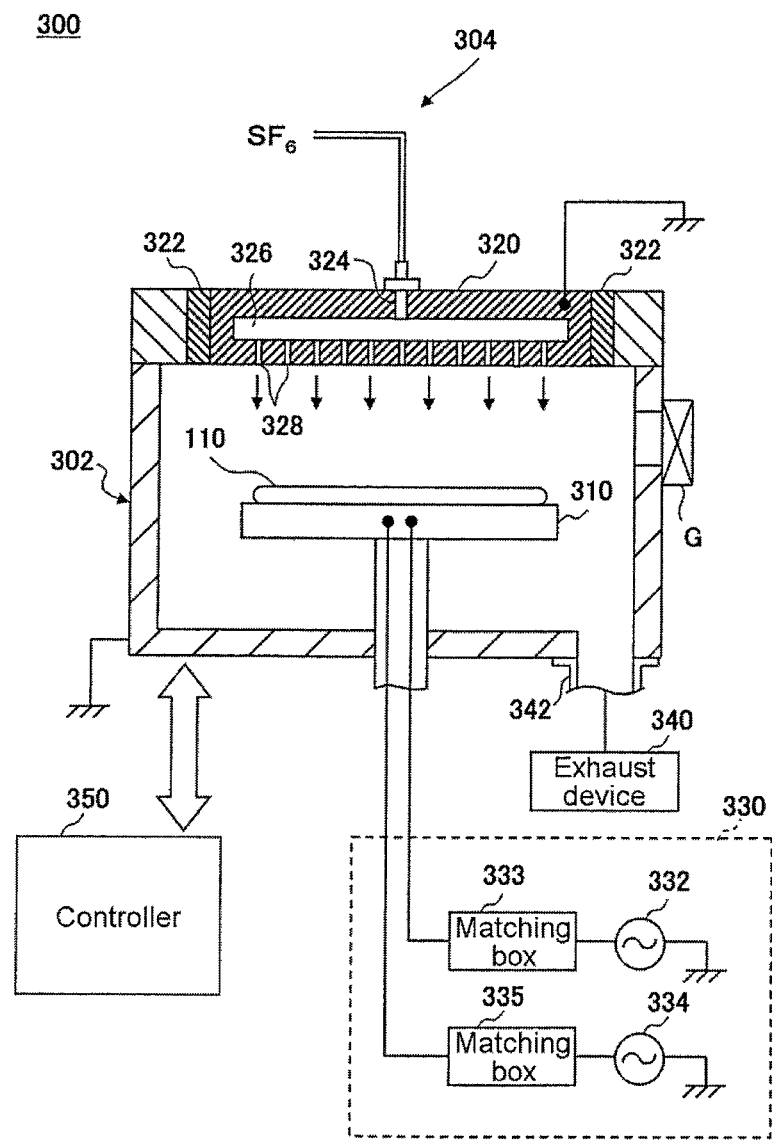
FIG. 11 is a cross-sectional view illustrating a schematic configuration of an etching device capable of performing the etching process illustrated in FIG. 4.

An example of the configuration of a plasma processing device that can perform the plasma etching will be described herein. Herein, description will be made with an example of a parallel flat plate type plasma processing device, which is disposed opposite to a lower electrode (susceptor) in the processing chamber and supplies a processing gas from an upper electrode into a processing chamber. FIG. 11 is a cross-sectional view illustrating a schematic configuration of a plasma processing device 300 according to the present exemplary embodiment.

The plasma processing device 300 includes a processing chamber 302 made of a conductive material such as, for example, aluminum and a gas supply system 304 that supplies a processing gas into the processing chamber 302, as illustrated in FIG. 11. Although only a sulfur hexafluoride ($SF_6$) is illustrated as a processing gas in FIG. 11 for the convenience, the kind or the number of the processing gas is not limited thereto. For example, other than sulfur hexafluoride ($SF_6$), chlorine ($Cl_2$), hydrogen bromide (HBr), carbon tetrafluoride ($CF_4$), or other etching gases may be used as the processing gas.

The processing chamber 302 is electrically grounded, and a lower electrode (susceptor) 310 that also functions as a loading table for placing the SiC substrate 110 as an etching target, and an upper electrode 320 disposed in parallel facing the lower electrode 310 are disposed in the processing chamber 302.

A power supply device 330 that supplies two-frequency overlap power is connected to the lower electrode 310. The power supply device 330 has a first high-frequency power supply 332 supplying a first high-frequency power having a first frequency (high-frequency power for producing plasma) and a second high-frequency power supply 334 supplying a second high-frequency power having a second frequency lower than the first frequency (high-frequency power for generating bias voltage). The first and second high-frequency power supplies 332 and 334 are electrically connected to the lower electrode 310 through first and second matching boxes 333 and 335, respectively.

The first and second matching boxes 333 and 335 are provided to match load impedance to the internal (output) impedance of the first and second high-frequency powers 332 and 334, respectively, and serve to externally match the internal impedance of the first and second high-frequency power supplies 332 and 334 with the load impedance when plasma is produced in the processing chamber 302.

The upper electrode 320 is attached to the ceiling portion of the processing chamber 302 by a shield ring 322 covering the peripheral portion thereof. The upper electrode 320 may be electrically grounded as illustrated in FIG. 11, or a predetermined DC voltage may be applied to the upper electrode 320 by connecting a variable DC power (not illustrated).

A gas inlet 324 for introducing a gas from the gas supply system 304 is formed in the upper electrode 320. A diffusion chamber 326 that diffuses the gas introduced through the gas inlet 324 is defined in the upper electrode 320.

A plurality of gas supply holes 328 for supplying the gas from the diffusion chamber 326 into the processing chamber 302 is formed in the upper electrode 320. The gas supply holes 328 are arranged to be able to supply gas to between the upper electrode 320 and the SiC substrate 110 on the lower electrode 310.

According to the upper electrode 320, the gas from the gas supply system 304 is supplied to the diffusion chamber 326 through the gas inlet 324, diffused therein and distributed to the gas supply holes 328, and discharged to the lower electrode 310 through the gas supply holes 328.

An exhaust hole 342 is formed through the bottom of the processing chamber 302, and thus, the inside of the processing chamber 302 may be maintained at a predetermined degree of vacuum by discharging the gas with an exhaust device 340 connected to the exhaust hole 342. A gate valve G opening/closing the carrying-in/out port for carrying in/out the SiC substrate 110 to/from the processing chamber 302 is disposed on the sidewall of the processing chamber 302.

The plasma processing device 300 includes a controller 350 controlling the entire operation of the device. The controller 350 includes an operating unit that is implemented by a touch panel, a keyboard or a display, and a memory unit that stores programs for controlling plasma etching or processing conditions (recipes) for executing the programs, which are not illustrated.

The controller 350 controls the parts by reading out a desired program and processing condition from the memory on the basis of an instruction from the operating unit, and is configured to control desired plasma etching in the plasma processing device 300. The programs and the processing conditions may be stored in a hard disk or a semiconductor memory, or may be stored in a storage medium that can be read by a portable computer such as a CD-ROM or a DVD and set at a predetermined position in the memory.

When plasma etching of the etching process illustrated in FIG. 4 is performed by the plasma processing device 300, the SiC substrate 110 (FIG. 5E) having the aluminum mask 160 formed in the metal mask forming process is first carried in to the processing chamber 302 and placed onto the lower electrode 310 by a transportation arm (not illustrated). Next, desired plasma etching is performed in the plasma processing device 300 by controlling the parts with the controller 350. As a result, a predetermined pattern of holes or trenches are formed on the SiC substrate 110 as illustrated in FIG. 5F.

(Etching Resistance)

Next, in order to examine etching resistance of the aluminum mask 160 according to the present exemplary embodiment, the result of the following test using the plasma processing device 300 will be described. The plasma etching is performed on a substrate having the aluminum mask 160 made of an aluminum paste according to the present exemplary embodiment and on a substrate having an aluminum mask formed by ion plating, and the results are compared. The processing conditions are as follows. The pressure in the processing chamber 210 is set to 15 mTorr, the power of the first high-frequency power supply 332 is set to 1200 W, the second high-frequency power supply 334 is not supplied to set to 0 W, and the flow rate of carbon tetrafluoride ($CF_4$) as a processing gas is set to 400 sccm. Etching is performed on the aluminum mask 160 for 15 minutes under the processing conditions, and etching is performed on the ion-plating film for 5 minutes. In the specification, it is assumed that 1 mTorr is $(10-3\times101325/760)$ Pa and 1 sccm is $(10-6/60)$ m3/sec.

For the aluminum mask 160 made in accordance with the present exemplary embodiment, the thickness before etching was 19.2 nm, the thickness after etching was 18.8 nm, and the etching ratio (E/R) was about 27 nm/min, in etching for 15 minutes.

Meanwhile, for the aluminum mask made by ion plating film, the thickness before etching was 1.62 nm, the thickness after etching was 1.58 nm, and the etching ratio (E/R) was about 8 nm/min, in etching for 5 minutes.

In terms of the etching ratio, the aluminum mask 160 made of an aluminum paste according to the present exemplary embodiment was larger than the aluminum mask made by ion plating film. It is considered that the etching ratio was increased due to the gaps between the particles of the aluminum paste. However, as described above, according to the aluminum mask made of an aluminum paste according to the present exemplary embodiment, since it is possible to easily increase the thickness thereof, even if the etching ratio is high, the thickness may be made to the extent that the aluminum mask is not lost by etching. Therefore, there is no disadvantage in etching, even if the etching ratio is larger than that of the aluminum mask formed by ion plating film.

As described above, according to the present exemplary embodiment, since the etching pattern of a metal mask is formed by a baked metal paste (e.g. a paste made of aluminum), it is possible to form an etching pattern having a very high verticality, as compared to a case where an etching pattern is formed by wet etching. In detail, since a resist film patterned with the reversal pattern obtained by reversing an etching pattern is first formed and a metal paste is filled in the reversal pattern, the filled metal paste may have a very high verticality.

That is, since it is possible to pattern a sidewall having a very high verticality in the resist film, the sidewall of a metal paste having a very high verticality may also be made by filling the pattern of the resist film with the metal paste. Further, since the metal mask is formed by filling and baking a metal paste, as the resist film is thicker, the metal mask may be made thicker. Since it is not the etching of a metal film as in the related art, a decrease in thickness of both of the metal paste and the resist film are not considered, and it is not required to determine the film thickness of the resist film in consideration of selectivity of the metal film and the resist film.

Since the resist film is removed while baking the metal paste by the heating control, it is possible to form a metal mask of an etching pattern having a very high verticality. In the present disclosure, since the resist film is also removed simultaneously in the process of baking the metal paste by the heating control, there is no need for a separate process of removing the resist film. Accordingly, it is possible to reduce the time taken to form a metal mask.

Further, since the thickness of the metal mask is regulated by regulating the film thickness of the resist film for forming the metal mask, it is possible to make a metal mask having an optimum thickness, corresponding to the etching amount of a semiconductor, which is an etching target. Accordingly, the present disclosure is particularly useful for a case where the etching depth required for a semiconductor that is an etching target is large (e.g. 90 µm or more).

Although preferred exemplary embodiments of the present disclosure were described with reference to the accompanying drawings, the present disclosure is not limited thereto. It will be apparent to those skilled in the art that various modifications and changes are possible within the scope of the claims and the modifications and changes are construed as being included in the scope of the present disclosure.

For example, although it was exemplified in the present exemplary embodiments that an aluminum mask is used as an example of a metal mask, the present disclosure is not limited thereto and any other metal masks may be used. In particular, a metal mask having a small etching ratio and a large selection ratio is preferred, and for the film, for example, chrome (Cr), cobalt (Co), nickel (Ni) and indium tin oxide (ITO) may be used. Since a metal mask made of a metal paste as described in the present disclosure may also be formed by using the substances, it is possible to pattern an etching pattern having a very high verticality.

INDUSTRIAL APPLICABILITY

The present disclosure is available for an etching method of performing a plasma etching of a semiconductor using a metal mask.

DESCRIPTION OF SYMBOL

10: metal mask
20: etching target film
22: recession
30: metal film
32: opening
40: resist film
42: opening
60: metal mask
62: opening
110: semiconductor (Sic substrate)
120: resist film
120a: reversal pattern
130: squeegee
140: metal paste (aluminum paste)
150: residual dross
160: metal mask (aluminum mask)
200: heat treatment device
210: processing chamber
212: ceiling wall
213: gas inlet
214: bottom wall
214a: opening
216: sidewall
218: baking target
220: loading table
222: loading table body
225: pillar
228: heater
230: heater power supply
232: exhaust unit
290: exhaust chamber
292: exhaust pipe
294: controller
300: plasma processing device
302: processing chamber
304: gas supply system
310: lower electrode
320: upper electrode
322: shield ring
324: gas inlet
326: diffusion chamber
328: gas supply hole
330: power supply device
340: exhaust device
342: exhaust hole
350: controller
G: gate valve

What is claimed is:

1. A method for etching a semiconductor, using a metal mask patterned with an etching pattern, the method comprising:
   forming a resist film patterned with a reversal pattern of an etching pattern onto the semiconductor, wherein in the reversal pattern, the resist film is formed at a location corresponding to an opening portion of the etching pattern, and further wherein in the reversal pattern, the resist film is not formed at a location corresponding to a mask portion of the etching pattern;
   filling the reversal pattern of the resist film with a metal paste at the location corresponding to the mask portion of the etching pattern;
   forming a metal mask having the etching pattern by removing the resist film while baking the metal paste with a heating control; and
   performing a plasma etching of the semiconductor using the metal mask.

2. The method of claim 1, wherein the heating control comprises:
   a first process of heating to a first temperature equal to or higher than a temperature at which the resist film is removed;
   a second process of maintaining the first temperature for a predetermined time; and
   a third process of heating to a second temperature higher than the first temperature, which is determined depending on the type of metal paste.

3. The method of claim 1, wherein in the metal mask forming process, the heating control is performed in a state where the metal paste and the resist film are turned upside down so that the metal mask and the resist film face down.

4. The method of claim 1, wherein the metal paste filling process fills the reversal pattern of the resist film with the metal paste by using a squeegee method.

5. The method of claim 1, wherein the metal paste is any one of paste types of aluminum, chrome, nickel and indium tin oxide.

6. The method of claim 1, wherein the semiconductor is any one of silicon carbide, silicon and gallium nitride.

7. The method of claim 1, wherein the reversal pattern of the resist film corresponds to holes or trenches formed on the semiconductor in the etching process, and
   a particle diameter of the metal paste is $1/10$ or less of the diameter of the holes or the width of the trenches.

8. The method of claim 1, wherein in the etching process, the semiconductor is etched in a depth of 90 μm or more deep or is etched such that the semiconductor is penetrated.

* * * * *